United States Patent [19]
Jackson

[11] 4,103,250
[45] Jul. 25, 1978

[54] FAST FREQUENCY HOPPING SYNTHESIZER

[75] Inventor: Harold Wofford Jackson, Baltimore, Md.

[73] Assignee: The Bendix Corporation, Southfield, Mich.

[21] Appl. No.: 836,122

[22] Filed: Sep. 23, 1977

[51] Int. Cl.² .............................................. H03B 3/08
[52] U.S. Cl. .................................... 331/1 A; 331/16
[58] Field of Search ..................... 331/1 A, 10, 16, 18; 328/14; 307/271; 325/452

[56] References Cited

U.S. PATENT DOCUMENTS

| | | | |
|---|---|---|---|
| 3,675,146 | 7/1972 | Langham | 331/1 A |
| 3,974,457 | 8/1976 | Bates et al. | 331/1 A |
| 4,023,103 | 5/1977 | Malm | 328/14 |

*Primary Examiner*—John Kominski
*Attorney, Agent, or Firm*—W. G. Christoforo; Bruce L. Lamb

[57] ABSTRACT

The output of a fast frequency hopping VCO is mixed with the output of a conventional slow acquisition frequency synthesizer to produce an IF which is applied to a frequency discriminator where the IF is compared with a reference IF to provide an error signal which is digitized and stored in a memory. Subsequently, the error signal is applied together with a command signal to the VCO to obtain the desired frequency output.

10 Claims, 1 Drawing Figure

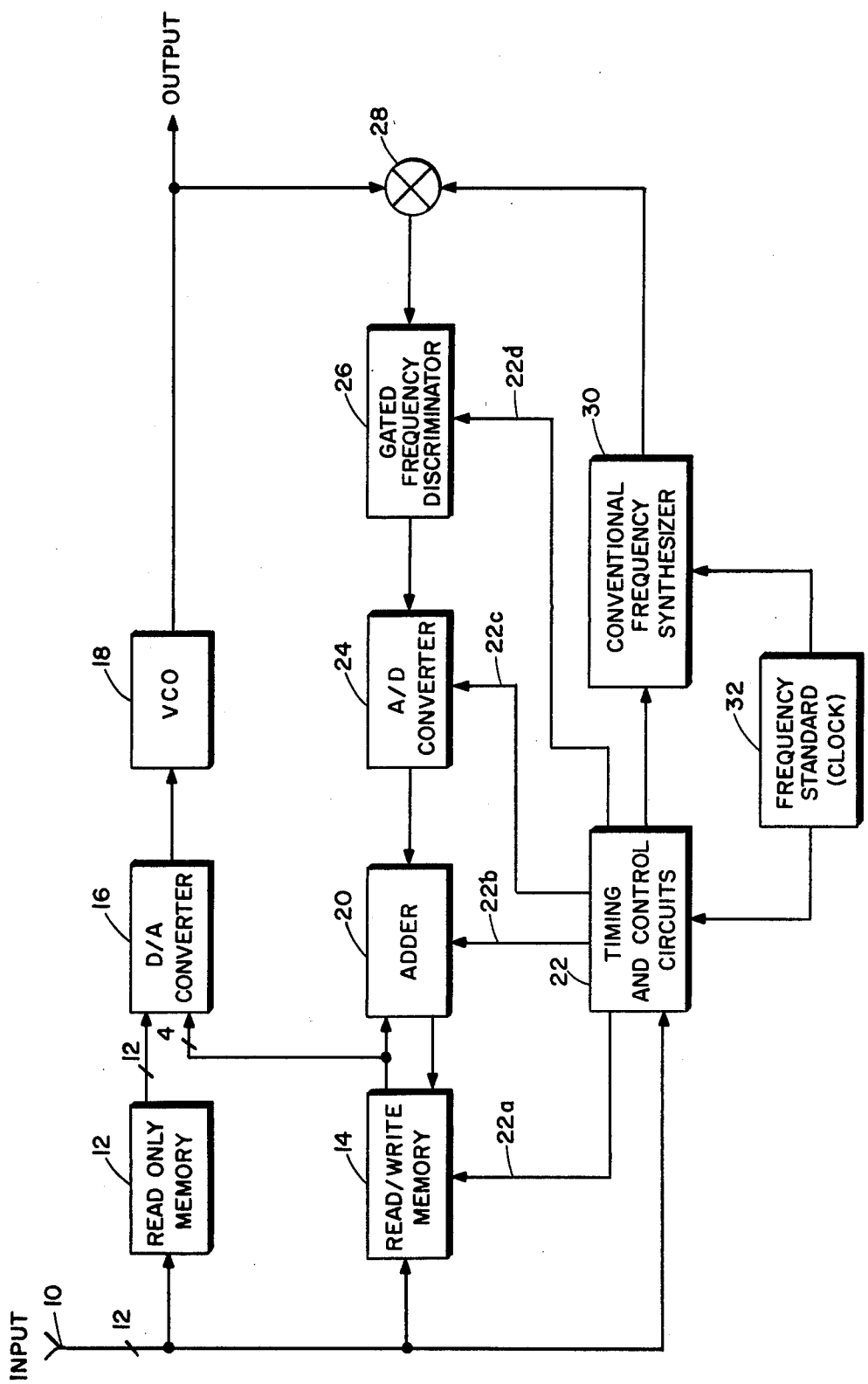

FAST FREQUENCY HOPPING SYNTHESIZER

BACKGROUND OF THE INVENTION

This invention relates to phase locked loop frequency synthesizers which can be made to hop very rapidly and accurately through a sequential and predetermined frequency schedule.

Fast frequency hopping synthesizers have their primary application in frequency agile radio frequency transmission systems where they are used for the generation of frequency signals in accordance with a predetermined frequency schedule. Frequency synthesizers employing indirect synthesis techniques have been used in such applications but are limited in the speed in which transitions between frequencies can be made to occur due to fundamental bandwidth constraints of phase locked loops used in such frequency synthesizers. Consequently, present fast frequency hopping synthesizers employ direct synthesis techniques which comprise a combination of switching and arithmetic manipulations such as mixing, multiplication and division to provide the desired rapid frequency hopping. The resulting frequency signals generated by these latter named frequency hopping synthesizers have relatively poor spectral purity due to the difficulty of eliminating undesired spurious mixer products, and other problems associated with such synthesizers such as switch leakage. In addition, fast frequency hopping synthesizers using such a direct synthesis implementation tend to be large and expensive due to complex filtering, shielding and radio frequency interference elimination requirements. Fast frequency hopping synthesizers using phase locked loop techniques solve many of the aforementioned problems associated with synthesizers operating in accordance with direct synthesis techniques. However, standard phase locked loop synthesizers are generally handicapped in their use in fast frequency hopping synthesizers, as previously mentioned, because of the limited speed at which they permit transitions between frequencies to be made.

SUMMARY OF THE INVENTION

An object of the present invention is to provide a fast frequency hopping synthesizer using a phase locked loop to rapidly hop through a predetermined frequency schedule so that it might be used in a frequency agile RF transmission system.

Another object of the present invention is to provide a frequency synthesizer of the type above described which operates in response to digital commands.

In the present invention the basic RF source is a phase locked loop having a voltage controlled oscillator (VCO) which is controlled from the output of a digital to analog (D/A) converter. The input of the D/A converter consists of two sources of data. The first source is derived from a read only memory (ROM) which performs a command data to tuning data transformation. This transformation is necessary because of the nonlinear VCO control characteristic as should be obvious to one skilled in this art. In essence, the output of the ROM constitutes a coarse frequency control signal. The second D/A converter source is derived from a read/write memory which will contain an error correction word corresponding to each possible frequency command. An error correction work is addressed out of the read/write memory, as well be explained below, and applied as the least significant bits of the D/A converter.

In the present preferred embodiment to be described the error correction word is obtained while the synthesizer is in actual operation, that is while it is rapidly hopping through the frequency schedule. Specifically, the output of the VCO is mixed with the output of a conventional indirect synthesizer which is slowly sequenced through all possible frequencies. At random times the VCO will be tuned to a frequency which is offset from the synthesizer so that the output of the mixer falls on a fixed intermediate frequency. During the dwell time on this frequency, the frequency error with respect to the synthesizer is measured by a gated frequency discriminator. The output of the discriminator is converted to digital form and with proper scaling becomes a suitable correction for the error correction word contained in the read/write memory. The read/write memory is addressed by the commands which, as aforementioned, comprise the desired frequency synthesizer output signal commands, so as to read the addressed error and the correction word out of the read/write memory as the least significant bits into the command. As the command, or input control data, is sequenced through all possible frequencies in pseudo random fashion error correction is accomplished at a rate sufficient to correct long-term drift due to temperature effects, aging and other deleterious conditions.

BRIEF DESCRIPTION OF THE DRAWINGS

The FIGURE is a block diagram of the invention.

DESCRIPTION OF THE PREFERRED EMBODIMENT

Referring to the FIGURE, a pseudo random series of command words is received from a source (not shown) at input means. The command words are suitably parallel by bit in format, each said command word corresponding to a desired output frequency signal to be generated by VCO 18 to comprise the output signal of the fast frequency hopping synthesizer of the invention. The command words are applied to address ROM 12 and read/write memory 14 which is in the form of a random access memory (RAM). ROM 12 performs a command word to VCO tuning data transformation, this transformation being necessary because of the nonlinear VCO control characteristic, it being desired that the VCO track the command words linearly.

The command words at input means 10 also address RAM 14 which in response thereto reads out the error correction word into D/A converter 16. As previously discussed, the error correction word comprises the least significant bits of a digital word applied to converter 16. In an embodiment actually built converter 16 was a 16 bit converter so that for example, ROM 12 provided 12 bits thereto and RAM 14 provided 4 bits thereto. The convention used in this description of a slash line through the communication line with the numeral in close proximity refers to the number of bits represented as being applied by that line. For example, the line communicating ROM 12 to converter 16 has a slash line and a 12 immediately above indicating the 12 bits communicated from ROM 12. In like manner the line connecting RAM 14 to converter 16 has a slash line and a 4 immediately above. It should be understood that in the preferred embodiment the digital signals applied to converter 16 are preferably in a parallel-by-digit format so that in actuality 16 lines are connected to the input of converter 16, 12 from ROM 12, and 4 from RAM 14. D/A converter 16, of course, converts to the digital word applied thereto to an analog voltage which controls the output of VCO 18 in the manner known to those skilled in the art.

A frequency standard 32 in the form of an accurate clock provides clock signals to timing and control circuits 22 and to a conventional frequency synthesizer 30. In the latter case, the clock signals comprise the reference for synthesizer 30. Timing and control circuits 22 include, for example, a counter which responds to the clock signals to cyclically count over a predetermined range, each individual number which the counter attains being equivalent to a command signal for synthesizer 30, whereby synthesizer 30 generates a different output frequency for each different count in the counter. It can thus be seen that synthesizer output signal is changing frequency along a predetermined schedule in response to the state of the counter in timing and control circuits 22.

It should be understood that the range of the possible counts in the counter included in circuits 22 encompass the range of possible command signals applied to input means 10. The command signals are compared to the state of the counter by a comparator in the timing and control circuits 22. A favorable comparison causes a qualifying signal to be generated on output lines 22a, 22b, 22c and 22d. The purpose of these qualifying signals will be explained below.

The output signal from synthesizer 30 is combined in mixer 28 with the output signal at terminal 34, that is, the output frequency signal from VCO 18. The difference or IF signal is applied to gated frequency discriminator 26. Adder 20, A/D converter 24, and gated frequency discriminator 26 are normally inactivated in the absence of a qualifying signal applied thereto. In addition, RAM 14 is in a read state in the absence of a qualifying signal. However, when the qualifying signal is generated by timing and control circuits 22 indicating that the state of the counter 15 therein corresponds to the input command signal, gated frequency discriminator 26 compares the IF signal applied thereto to an internal reference to generate an error signal. It should be understood that synthesizer 30 is offset somewhat from VCO 18 so that during a favorable comparison in timing and control circuits 22 the IF signal output from mixer 28 is some predetermined frequency not zero. The error signal from discriminator 26 is converted to a digital word by A/D converter 24 and applied to adder 20. The use of adder 20 is optional, it performing the function of integration or averaging of the error signal in RAM 14 with the new error signal generated by A/D converter 24 so that large instantaneous changes of the error signal recorded in RAM 14 generally avoided.

It should also be understood that the qualification signal generated by timing and control circuits 22 occurs some finite time after the particular command signal has been applied to input means 10, this time being sufficient to permit synthesizer 30 to settle to its commanded frequency. During the time before the qualification signal is generated the error signal for that particular command signal is read out of memory 14 and applied not only to converter 16 but also to adder 20 so that it can be combined with the new error signal for processing as described above once the qualification signal is generated. The resultant new error signal from adder 20 is now loaded into RAM 14 at the address indicated by the command signal at input means in response to the qualification signal on line 22a.

It can be seen from the above description that a favorable comparison is obtained in timing and control circuits 22 on a purely random basis. In a device actually built, this favorable comparison occurred approximately once every ten seconds.

Having described this preferred embodiment of my invention, various modifications and alterations thereof should now become obvious to one skilled in the art. Accordingly, the invention is to be limited only by the true scope and spirit of the appended claims.

The invention claimed is:

1. A fast frequency hopping synthesizer which responds to command signals applied thereto comprising:
    an addressable memory means containing a plurality of error signals addressed by said command signals; and,
    a variable frequency oscillator means for generating an output frequency in response to a combination of an instantaneous command signal and an instantaneously addressed error signal.

2. The fast frequency hopping synthesizer of claim 1 wherein said addressable memory comprises a read/write memory and including additionally an indirect frequency synthesizer for generating frequency signals in accordance with a predetermined schedule;
    means comparing said frequency signals with said output frequency to generate a qualification signal;
    means for generating a particular error signal in response to said frequency signals and said output frequency; and,
    means for adjusting said read/write memory in accordance with said particular error signal in response to said qualification signal.

3. The fast frequency hopping synthesizer of claim 2 wherein said read/write memory is normally in a read mode.

4. The fast frequency hopping synthesizer of claim 1 wherein said variable frequency oscillator comprises a controlled oscillator and said command and error signals comprise digital signals, and including means for combining a command signal and an associated error signal into a form usable by said controlled oscillator.

5. The fast frequency hopping synthesizer of claim 1 wherein said variable frequency oscillator comprises a voltage controlled oscillator and said command and error signals comprise digital signals, a command signal comprising the most significant bits and an associated error signal comprising the least significant bits of a digital command signal and including a digital-to-analog converter for converting said digital command signal to a form usable by said voltage controlled oscillator.

6. A fast frequency hopping synthesizer which responds to a pseudo random series of command words comprising:
    an addressable memory means containing a plurality of individually addressed error signals;
    a variable frequency oscillator means for generating an output in response to a combination of a first command signal and an associated error signal, said addressable memory means being addressed by said first command signal to recall said associated error signal;
    a frequency synthesizer employing indirect synthesis techniques and responsive to second command signals for generating a sequence of frequency signals, the range of said second command signals encompassing at least the range of said first command signals;

means comparing said first command signals with said second command signals for generating a qualification signal when the comparison is proper;

means responsive to said qualification signal for comparing said sequence of frequency signals with said variable frequency oscillator means output to generate a second error signal; and, means for adjusting said associated error signal in response to said second error signal.

7. The fast frequency hopping synthesizer of claim 6 wherein said addressable memory means comprises a random access memory.

8. The fast frequency hopping synthesizer of claim 6 wherein said means responsive to said qualification signal comprises:

means for mixing said sequence of frequency signals with said variable frequency oscillator means output to produce an intermediate frequency signal; and, a frequency discriminator means responsive to said intermediate frequency signal to generate said second error signal.

9. The fast frequency hopping synthesizer of claim 8 wherein said frequency discriminator means comprises a frequency discriminator responsive to said intermediate frequency signal to generate said second error signal in analog format and an analog-to-digital converter for converting the analog format of said second error signal into a digital format, said means for adjusting being responsive to said second error signal in digital format.

10. The fast frequency hopping synthesizer of claim 9 wherein said variable frequency oscillator means comprises a voltage controlled oscillator.

* * * * *